(12) United States Patent
Cho et al.

(10) Patent No.: US 7,798,802 B2
(45) Date of Patent: Sep. 21, 2010

(54) DUAL-SIDE IMPRINTING LITHOGRAPHY SYSTEM

(75) Inventors: Eun-hyoung Cho, Seoul (KR); Sung-hoon Choa, Seoul (KR); Jin-seung Sohn, Seoul (KR); Du-hyun Lee, Suwon-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 25 days.

(21) Appl. No.: 12/035,702

(22) Filed: Feb. 22, 2008

(65) Prior Publication Data
US 2009/0061035 A1    Mar. 5, 2009

(30) Foreign Application Priority Data
Aug. 29, 2007   (KR) .................. 10-2007-0087311

(51) Int. Cl.
*B29C 59/00* (2006.01)
*B29B 13/08* (2006.01)
(52) U.S. Cl. .................... 425/385; 425/174.4
(58) Field of Classification Search ............. 425/385, 425/174.4; 264/293
See application file for complete search history.

(56) References Cited
U.S. PATENT DOCUMENTS

| | | | |
|---|---|---|---|
| 7,137,803 B2 * | 11/2006 | Chou | 425/405.1 |
| 7,363,854 B2 * | 4/2008 | Sewell | 101/41 |
| 2004/0149367 A1 * | 8/2004 | Olsson et al. | 156/64 |
| 2005/0116391 A1 * | 6/2005 | Lindemann et al. | 264/497 |
| 2005/0172848 A1 * | 8/2005 | Olsson | 101/493 |
| 2005/0227497 A1 * | 10/2005 | Padovani | 438/758 |
| 2006/0006580 A1 * | 1/2006 | Olsson et al. | 264/293 |

* cited by examiner

*Primary Examiner*—Maria Veronica D Ewald
(74) *Attorney, Agent, or Firm*—Sughrue Mion, PLLC (57) ABSTRACT

Provided is a dual-side imprinting lithography system that includes a medium supporting unit that supports a medium wherein both surfaces of the medium are coated with a ultraviolet (UV) hardening resin; a first mold supporting unit and a second mold supporting unit that respectively support a first mold and a second mold, disposed respectively above the medium supporting unit and under the medium supporting unit; a vertical moving device that moves vertically at least one of the medium supporting unit, the first mold supporting unit, and the second mold supporting unit; a first UV radiating device that is installed above the first mold supporting unit to radiate UV rays; and a second UV radiating device that is installed under the second mold supporting unit to radiate UV rays.

10 Claims, 8 Drawing Sheets

DUAL-SIDE IMPRINTING LITHOGRAPHY SYSTEM

CROSS-REFERENCE TO RELATED PATENT APPLICATION

This application claims the benefit of Korean Patent Application No. 10-2007-0087311, filed on Aug. 29, 2007, in the Korean Intellectual Property Office, the disclosure of which is incorporated herein in its entirety by reference.

BACKGROUND OF THE INVENTION

1. Field of the Invention

The present invention relates to an imprint lithography system, and more particularly, to a dual-side imprinting lithography system that performs nano-imprinting on both sides of a medium to be patterned.

2. Description of the Related Art

Imprint lithography is a technique of directly imprinting a mold pattern onto a substrate using a press. In this case, imprinting of complicated step differences on the substrate may be relatively simply formed. In a conventional method, multiple photolithography processes are required for patterning of complicated step differences. However, in imprint lithography, since a mold pattern is directly printed on the substrate, imprinting is completed with single pressing. Therefore, imprint lithography is very useful when a multi-step shape is transferred.

Imprint lithography may be largely dived into two methods. The first method is a hot embossing or a thermal imprint lithography in which a polymer layer having fluidity is formed using heat, and then a desired pattern is formed on the polymer layer by contacting the polymer layer to a patterned mold having a desired pattern and physically pressing them against each other.

The second method is ultraviolet (UV) assisted imprint lithography in which a UV resin having low viscosity is coated on a substrate, and then the UV resin is allowed to contact a mold having a pattern, and a desired pattern is formed by hardening the UV resin by radiating UV rays. In the UV assisted imprint lithography method, a transparent mold formed of, for example, quartz, must be used since the UV resin must be hardened using UV rays.

The above two methods are widely used in various fields according to their advantages and disadvantages.

In particular, many attempts have been conducted to use the UV assisted imprint lithography technique to manufacture patterned media of hard disc drives (HDDs). Since the UV assisted imprint lithography method is performed using low pressure at room temperature, this method is advantageous particularly in nano scale patterning, compared to the thermal imprinting method that is performed using high pressure at high temperature.

However, in order to use the UV assisted imprint lithography technique for manufacturing patterned media, the process of manufacturing the patterned media must be compatible with the process of manufacturing conventional HDD media, and in order to achieve mass production, the nano-imprinting process must be performed on both sides of the patterned media.

SUMMARY OF THE INVENTION

To solve the above and/or other problems, the present invention provides a dual-side imprinting lithography system that performs imprinting on both sides of patterned media by applying the UV assisted imprint lithography technique to manufacture patterned media of hard disc drives (HDDs).

According to an aspect of the present invention, there is provided a dual-side imprinting lithography system comprising: a medium supporting unit that supports a medium, wherein both surfaces of the medium are coated with a ultraviolet (UV) hardening resin; a first mold supporting unit and a second mold supporting unit that respectively support a first mold and a second mold, disposed respectively above the medium supporting unit and under the medium supporting unit; a vertical moving device that moves vertically at least one of the medium supporting unit, the first mold supporting unit, and the second mold supporting unit; a first UV radiating device that is installed above the first mold supporting unit to radiate UV rays; and a second UV radiating device that is installed under the second mold supporting unit to radiate UV rays.

The dual-side imprinting lithography system may further comprise a chamber that accommodates the medium supporting unit, the first mold supporting unit, and the second mold supporting unit, and a vacuum apparatus connected to the chamber.

The dual-side imprinting lithography system may further comprise a linear guide installed above the chamber, wherein the first UV radiating device is installed on the linear guide.

The dual-side imprinting lithography system may further comprise an alignment optical device installed on the linear guide.

The second UV radiating device may be an optical path changing member that supplies UV rays received from the first UV radiating device to the second mold. The optical path changing member may comprise an annular concave mirror.

The dual-side imprinting lithography system may further comprise a UV reducing filter that is installed in a region where UV rays enter into the first mold from the first UV radiating device to reduce an intensity of the UV rays radiated onto the first mold. The UV reducing filter may be a neutral density (ND) filter.

The first mold supporting unit may be fixedly installed in the chamber, the medium supporting unit may be movably installed between the first mold supporting unit and the second mold supporting unit, and the vertical moving device may drive the second mold supporting unit, and may further comprise an X-Y stage that drives the second mold supporting unit in two-axis directions and a locking device that selectively fixes the second mold supporting unit and the medium supporting unit.

The dual-side imprinting lithography system may further comprise a rotation stage that rotates the second mold supporting unit.

The dual-side imprinting lithography system may further comprise a dual-side coating device that simultaneously coats the UV hardening resin on the both surfaces of the medium, wherein the dual-side coating device comprises: a fixing chuck that fixes the medium; a vertical driving unit that moves the fixing chuck vertically; a rotation driving unit that rotates the fixing chuck; and a resin storage unit that contains the UV hardening resin.

BRIEF DESCRIPTION OF THE DRAWINGS

The above and other features and advantages of the present invention will become more apparent by describing in detail exemplary embodiments thereof with reference to the attached drawings in which.

DETAILED DESCRIPTION OF THE INVENTION

The present invention will now be described more fully with reference to the accompanying drawings in which exemplary embodiments of the invention are shown. The invention may, however, not be construed as being limited to the embodiments set forth herein; rather, these embodiments are provided so that this disclosure will be thorough and complete, and will fully convey the concept of the invention to those skilled in the art. In the drawings, the thicknesses of layers and regions are exaggerated for clarity, and like reference numerals refer to the like elements.

Figure 1:
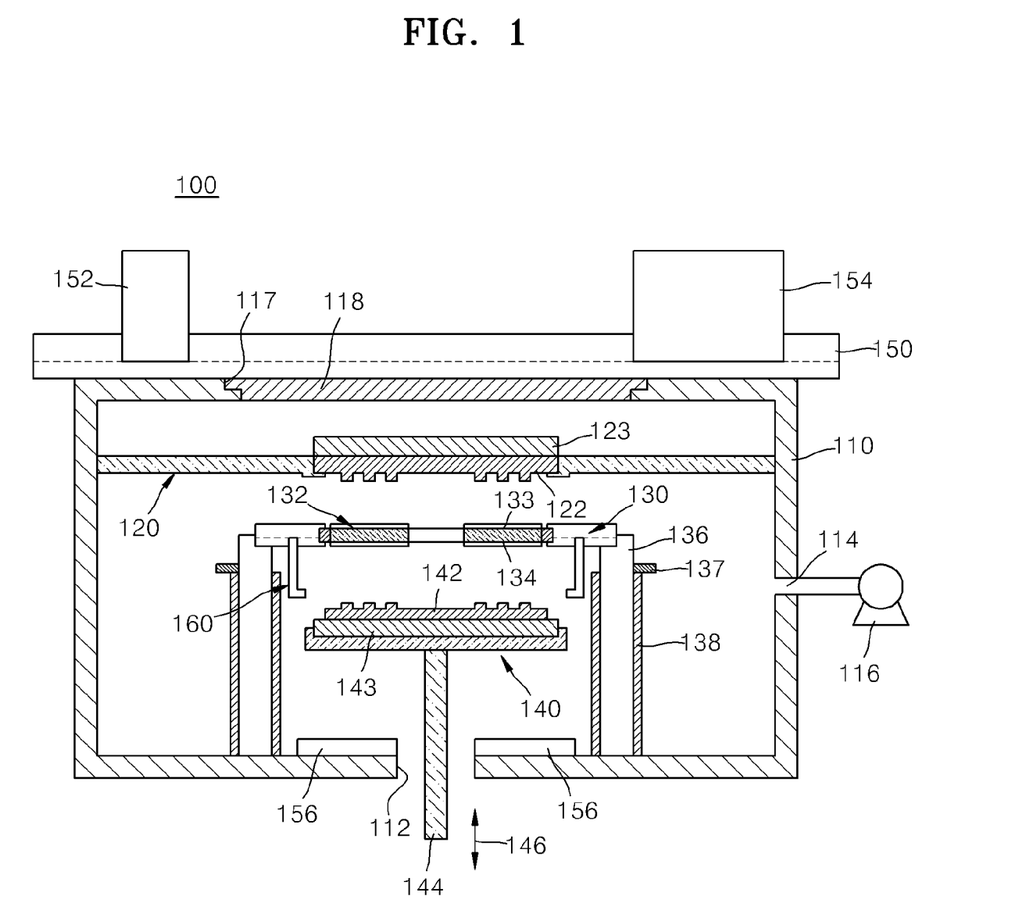
FIG. 1 is a schematic cross-sectional view of a dual-side imprinting lithography system according to an embodiment of the present invention.

FIG. 1 is a schematic cross-sectional view of a dual-side imprinting lithography system 100 according to an embodiment of the present invention.

Referring to FIG. 1, the dual-side imprinting lithography system 100 includes a medium supporting unit 130, a first mold supporting unit 120 located above the medium supporting unit 130, and a second mold supporting unit 140 located below the medium supporting unit 130.

A medium 132 is fixed on the medium supporting unit 130. A ultraviolet (UV) hardening resin is coated on first and second surfaces 133 and 134 of the medium 132, and a first mold 122 having a pattern on a surface that faces the first surface 133 of the medium 132 is fixed on the first mold supporting unit 120. A second mold 142 having a pattern on a surface that faces the second surface 134 of the medium 132 is fixed on the second mold supporting unit 140. Magnetic films (not shown) are formed on the first and second surfaces 133 and 134 of the medium 132, respectively.

The first mold supporting unit 120 may be fixedly installed in a chamber 110.

Both ends of the medium supporting unit 130 respectively are connected to first cylinder rods 136. The first cylinder rods 136 are disposed in pipes 138 that guide the first cylinder rods 136 to move in a linear motion, and thus, the first cylinder rods 136 may move between the first mold supporting unit 120 and a first position. Stoppers 137 attached to the first cylinder rods 136 limit the medium supporting unit 130 to stay at the first position when the stoppers 137 are located on upper ends of the pipes 138.

The second mold 142 is mounted on the second mold supporting unit 140, and a second cylinder rod 144 is connected to the lower surface of the second mold supporting unit 140. The second cylinder rod 144 moves vertically by a vertical moving device 146. If the second mold supporting unit 140 moves upwards by the vertical moving device 146, the medium 132 of the medium supporting unit 130 contacts the second mold 142 of the second mold supporting unit 140. When the second mold supporting unit 140 is further moved upwards, the medium 132 of the medium supporting unit 130 contacts the first mold 122 of the first mold supporting unit 120. Thus, the resins on the medium 132 sequentially contact the second mold 142 and the first mold 122, and thus, a nano-imprinting is achieved.

A first hole 112 which is a moving path of the second cylinder rod 144 is formed in a lower part of the chamber 110, and a gap, for example, a few mm, between the hole 112 and the second cylinder rod 144 may be formed for an alignment which will be described later.

A vacuum apparatus is connected to the chamber 110 to maintain the chamber 110 at a pressure of $1 \times 10^{-1}$ Torr or less. The vacuum apparatus may be a vacuum pump 116 or a vacuum pressure line (not shown). A second hole 114 connects the chamber 110 to the vacuum pump 116 or the vacuum pressure line.

A linear guide 150 is installed above the chamber 110, and an alignment optical device 152 and a first UV radiating device 154 are installed on the linear guide 150.

The second cylinder rod 144 may be connected to an X-Y stage (not shown) and a rotation stage (not shown). The X-Y stage drives the second mold supporting unit 140 in two axis directions, and the rotation stage rotates the second mold supporting unit 140.

A window 117 for transmitting UV rays is formed in the upper part of the chamber 110. The window 117 may be installed with an optical transparent material, for example, quartz 118. The window 117 is used for observing an alignment between the mold 122 or 142 and the medium 132 using the alignment optical device 152, and for radiating UV rays onto the UV hardening resin coated on the first surface 133 of the medium 132 using the first UV radiating device 154.

A first polydimethylsiloxane (PDMS) pad 123 may be installed on the first mold 122 so that a pattern of the first mold 122 may be uniformly imprinted onto the medium 132 at a large scale when the second mold 122 is imprinted. Since the first PDMS pad 123 is optical transparent, it does not block the UV hardening. A second PDMS pad 143 may be installed between the second mold 142 and the second mold supporting unit 140. The second PDMS pad 143 may do a role as the first PDMS pad 123.

A second UV radiating device 156 may be installed on a bottom of the chamber 110. The second UV radiating device 156 may be used for radiating UV rays onto the UV resin coated on the second surface 134 of the medium 132.

The linear guide 150 is used for linearly locating the alignment optical device 152 or the first UV radiating device 154 on the window 117, and is used for moving the alignment optical device 152 and the first UV radiating device 154 away from the window 117. Control motors (not shown) for driving the alignment optical device 152 and the first UV radiating device 154 may further be installed on the linear guide 150.

A locking device 160 may be installed on the medium supporting unit 130 to selectively fix the second mold supporting unit 140 to the medium supporting unit 130, the operation of the locking device 160 will be described later.

Figure 2:
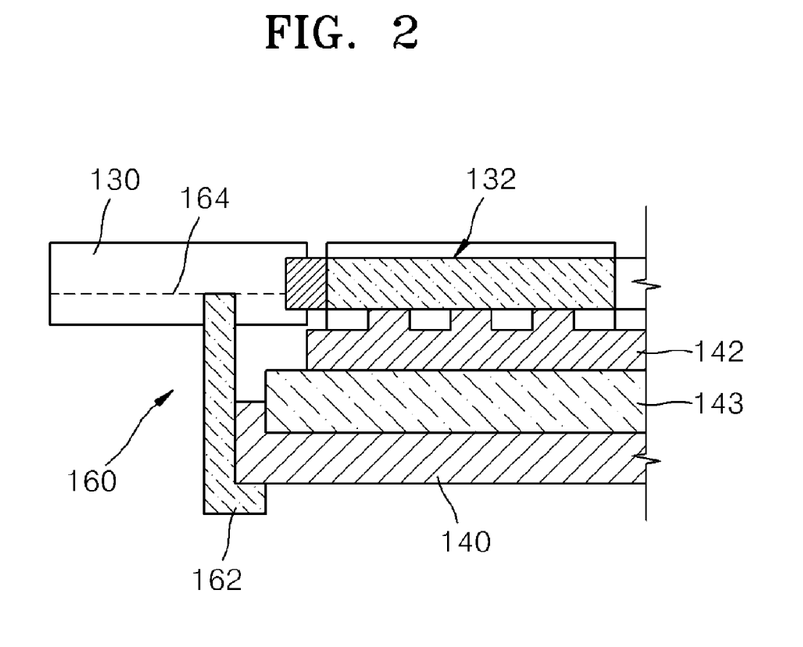
FIG. 2 is a cross-sectional view showing a locking device of the dual-side imprinting lithography system of FIG. 1.

FIG. 2 is a cross-sectional view of the locking device 160 in FIG. 1. Referring to FIG. 2, a fixed pin 162 is installed on a lower side of the medium supporting unit 130. The fixed pin 162 moves linearly on a linear guide 164 by a motor (not shown) to selectively fix a lower part of the second mold supporting unit 140 to the medium supporting unit 130. Thus, the medium supporting unit 130 may be moved up and down together with the second mold supporting unit 140, and also, according to the driving of the X-Y stage and the rotation stage, an alignment between the medium 132 of the medium supporting unit 130 and the first mold 122 on the first mold supporting unit 120 may be performed.

The UV hardening resin is coated on both surfaces 133 and 134 of the medium 132 using spin coating method. However, it is difficult to coat the both sides of the medium 132 using a conventional spin coating method. In the conventional spin coating method, after the first surface 133 of the medium 132 is spin coated, the second surface 134 is spin coated, and the coating of the second surface 134 may be thicker than that of the first surface 133. Thus, a dual-side coating device 170 in FIG. 3 that may simultaneously spin coat on the first surface 133 and the second surface 134 of the medium 132 is needed.

Figure 3:
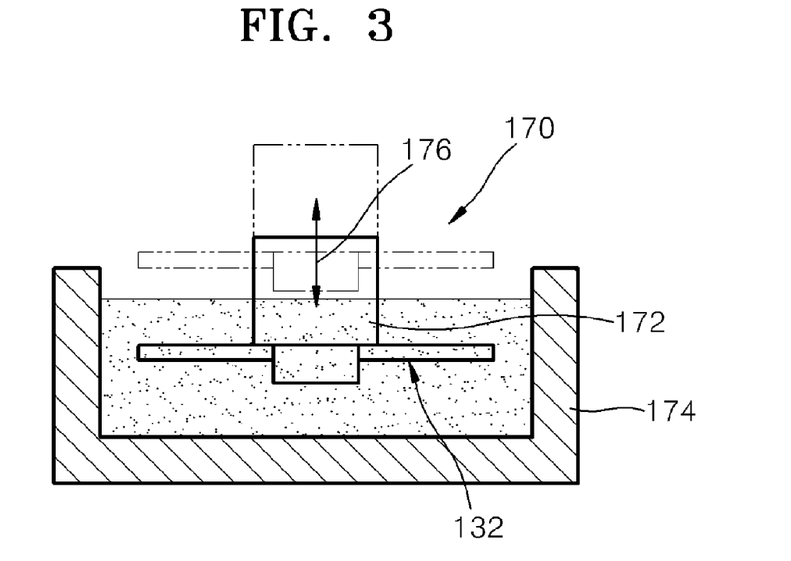
FIG. 3 is a cross-sectional view showing a dual-side coating device of the dual-side imprinting lithography system of FIG. 1.

FIG. 3 is a cross-sectional view of the dual-side coating device 170 in FIG. 1.

Referring to FIG. 3, a vertical driving unit 176 that moves a fixing chuck 172 up and down and a rotation driving unit (not shown) that rotates the fixing chuck 172 are installed on a resin storage unit 174 in which UV hardening resin is stored. The fixing chuck 172 fixes the medium 132 through a center hole of the medium 132.

A method of using the dual-side coating device 170 will now be described with reference to the accompanying drawings. An adhesion promoter may be coated on both surfaces of the medium 132 in order to increase surface energy of the medium 132. The adhesion promoter facilitates the resin to be coated thin on the surfaces of the medium 132.

The medium 132 fixed on the fixing chuck 172 is dipped into the resin of the resin storage unit 174 using the vertical driving unit 176. Next, after moving the medium 132 fixed on the fixing chuck 172 upward above the resin of the resin storage unit 174 using the vertical driving unit 176, the fixing chuck 172 is rotated using the rotation driving unit. Thus, the resin with a predetermined uniform thickness, for example, 100 nm or less, may be coated on the both surfaces of the medium 132. A thickness difference between the both surfaces of the medium 132 caused by gravitation may be reduced using the above spin coating method.

The dual-side coating device 170 may be used by attaching it to the dual-side imprinting lithography system 100 according to the present invention or may be used separately from the dual-side imprinting lithography system 100.

A method of imprinting a nano-scale pattern on a large scale area using the dual-side imprinting lithography system 100 according to an embodiment of the present invention will now be described with reference to FIGS. 4A through 4E.

FIGS. 4A through 4E are cross-sectional views for explaining a method of nano-scale imprinting on both large scale surfaces of a medium 132 using the dual-side imprinting lithography system 100.

Figure 4A:
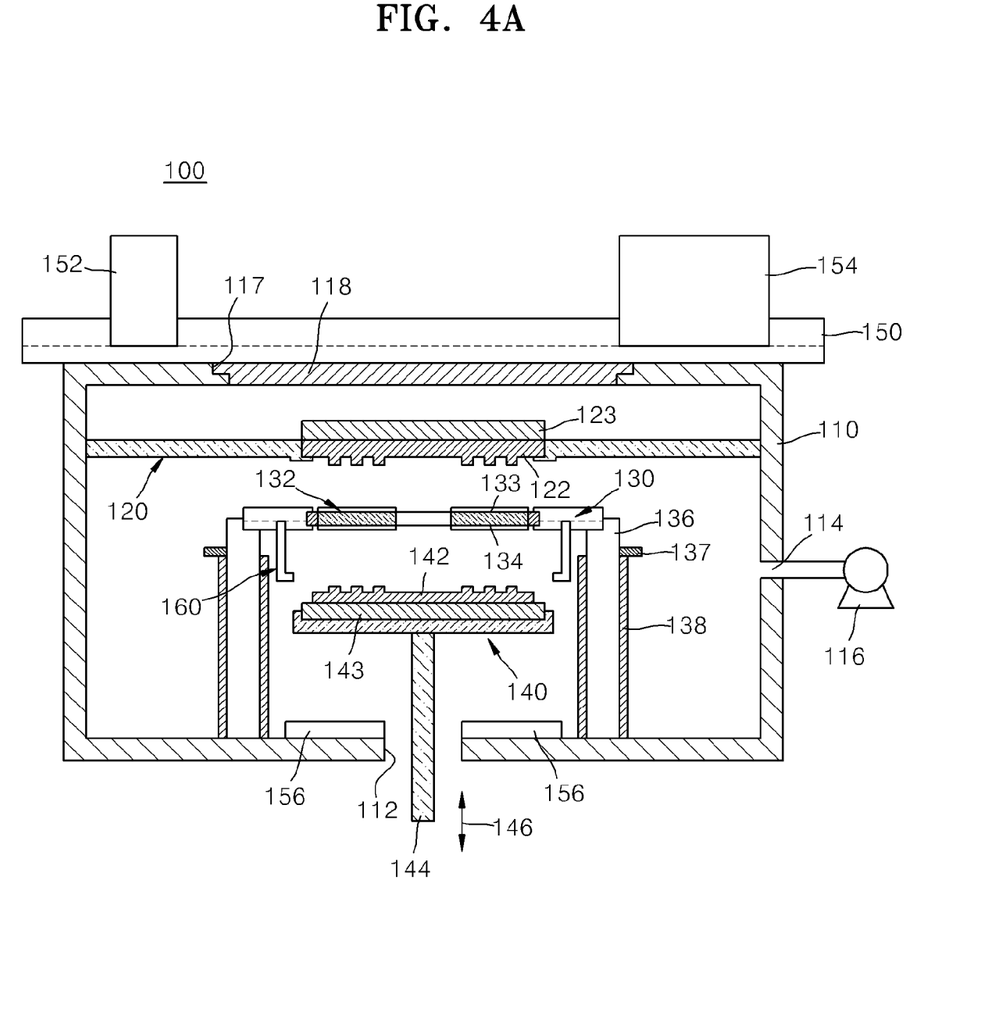
FIGS. 4A through 4E are cross-sectional views for explaining a method of nano-imprinting a pattern on a large scale substrate using the dual-side imprinting lithography system of FIG. 1.

Referring to FIG. 4A, a UV hardening resin for forming a pattern mold is coated on an upper surface 133 and lower surface 134 of the medium 132. Prior to coating the UV hardening resin, an adhesion promoter may be coated on both surfaces of the medium 132 so that the UV hardening resin may be easily coated on the surfaces of the medium 132. Next, the medium 132 is mounted on the medium supporting unit 130. The UV hardening resin may be coated on both surfaces of the medium 132 using the dual-side coating device 170.

The first and second molds 122 and 142 on which a pattern is formed respectively are installed on the first mold supporting unit 120 and the second mold supporting unit 140 so that the patterns of the first and second molds 122 and 142 face the first surface 133 and the second surface 134 of the medium 132. A self assembled monolayer (SAM) may be coated on the patterns of the first and second molds 122 and 142 for the release of the molds 132 and 142.

The chamber 110 is maintained at a pressure of $1 \times 10^{-1}$ Torr or less using the vacuum pump 116 in order to perform a uniform nano-imprinting by preventing air traps between the molds 122 and 142 and the resin when a large scale nano-imprinting is performed.

Figure 4B:
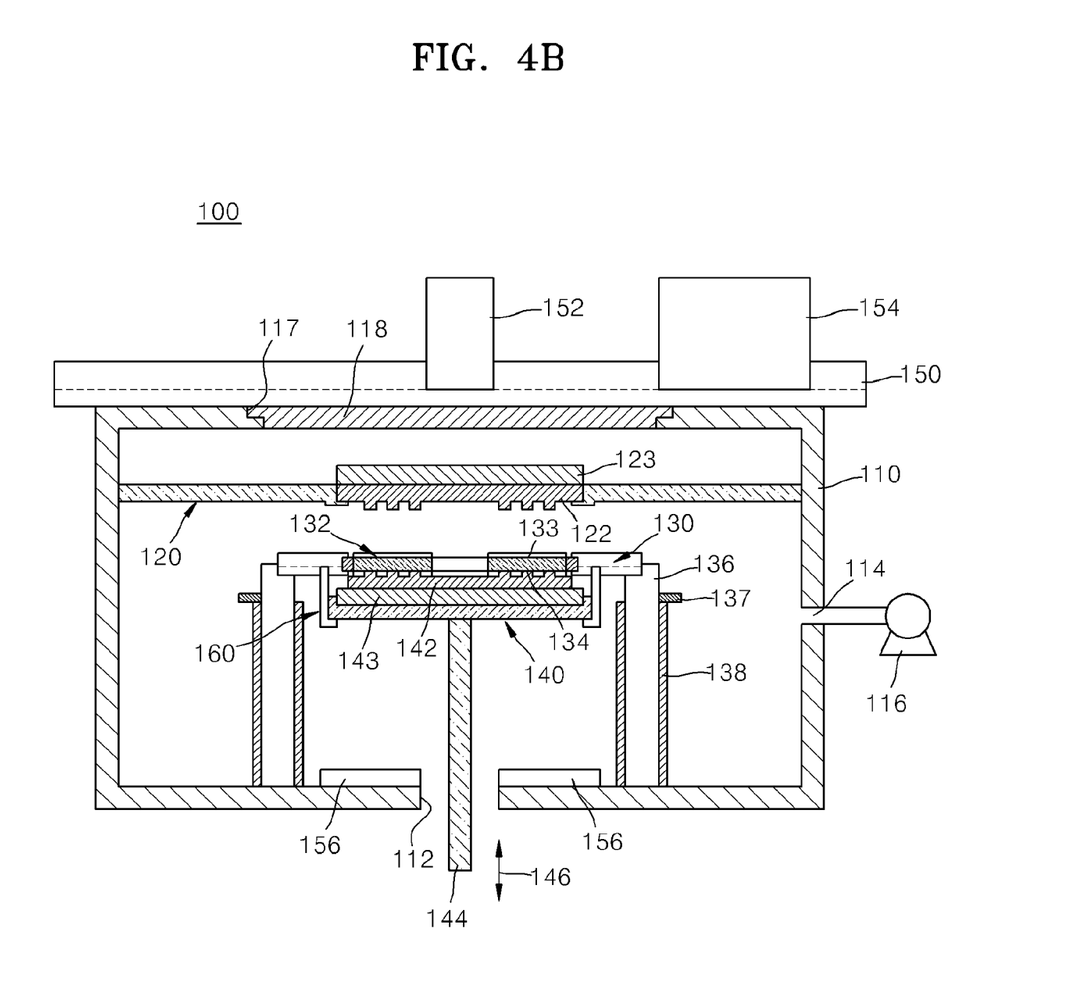

Referring to FIG. 4B, the second surface 134 of the medium 132 contacts the second mold 142 by moving the second mold supporing unit 140 using the vertical moving device 146. At this point, the UV hardening resin formed on the second surface 134 of the medium 132 is patterned to an opposite shape of the pattern of the second mold 142.

Next, the alignment optical device 152 on the linear guide 150 is moved on the window 117 and an alignment between the second mold 142 and the medium 132 is performed. For this purpose, the second cylinder rod 144 of the second mold supporting unit 140 may be driven using the X-Y stage and the rotation stage. After the alignment between the second mold 142 and the medium 132 is completed, the lower part of the medium supporting unit 130 is fixed by moving the fixed pin 162 of the locking device 160 inwards.

Figure 4C:
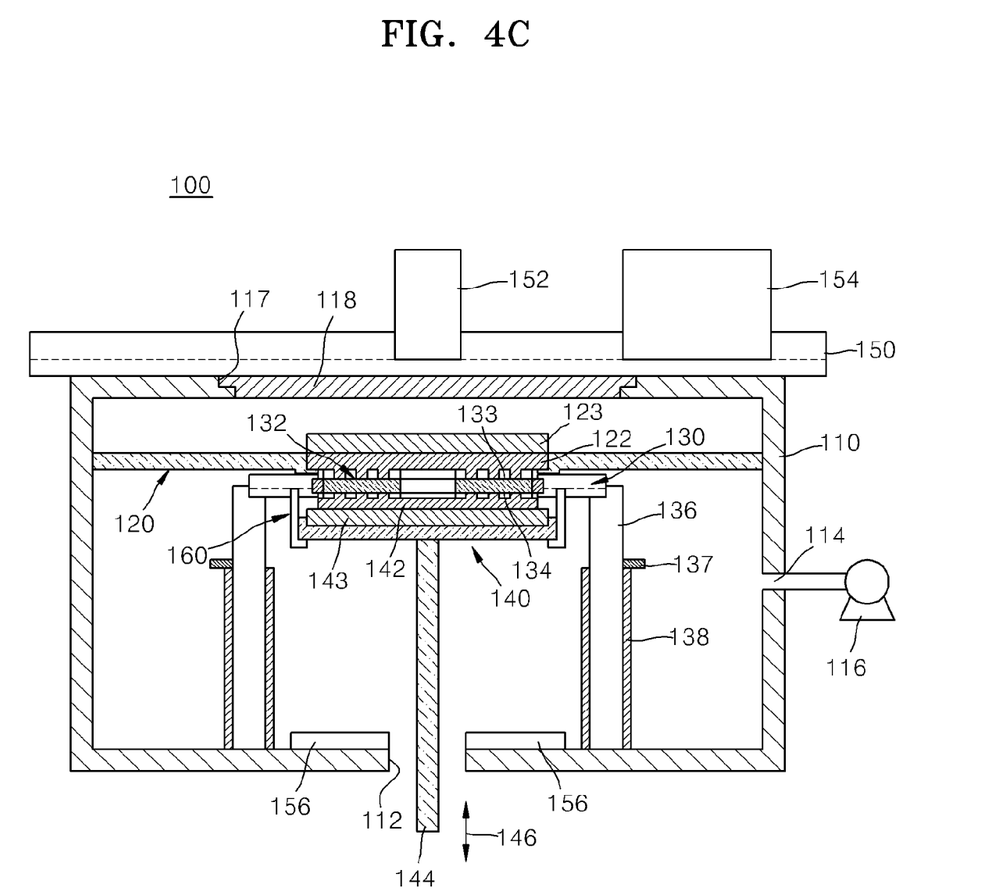

Referring to FIG. 4C, after the alignment process between the medium 132 and the second mold 142 is completed, the medium supporting unit 130 and the second mold supporting unit 140 are moved upwards using the vertical moving device 146 until the moving of the medium supporting unit 130 is limited by the first mold supporting unit 120. At this point, the first surface 133 of the medium 132 may be patterned by the first mold 122.

Next, an alignment process between the first mold 122 and the medium 132 is performed using the alignment optical device 152. For this purpose, the second cylinder rod 144 may be driven using the X-Y stage and the ration stage.

After the alignment between the first mold 122 and the medium 132 is completed, the alignment optical device 152 on the linear guide 150 is moved away from the window 117, and the first UV radiating device 154 is moved above the window 117.

Next, UV rays are radiated onto the UV hardening resins formed on the first and second surfaces 133 and 134 of the medium 132 using the first UV radiating device 154 and the second UV radiating device 156, and thus, nano-imprint patterns are formed on the first and second surfaces 133 and 134 of the medium 132.

Figure 4D:
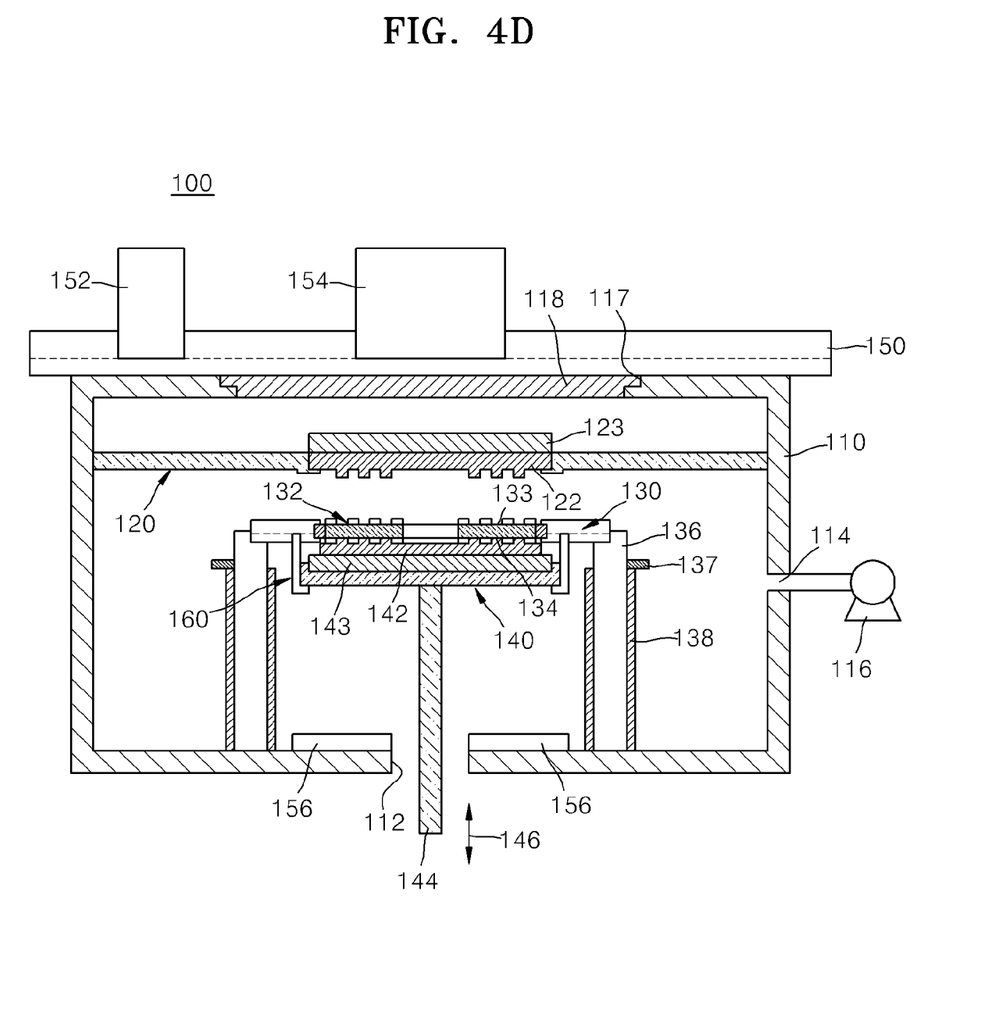

Referring to FIG. 4D, when the second mold supporting unit 140 is moved downwards by driving the vertical moving device 146, the medium supporting unit 130 and the second mold supporting unit 140 are moved downwards and stops on the first position of the medium supporting unit 130 by the stopper 137.

Figure 4E:
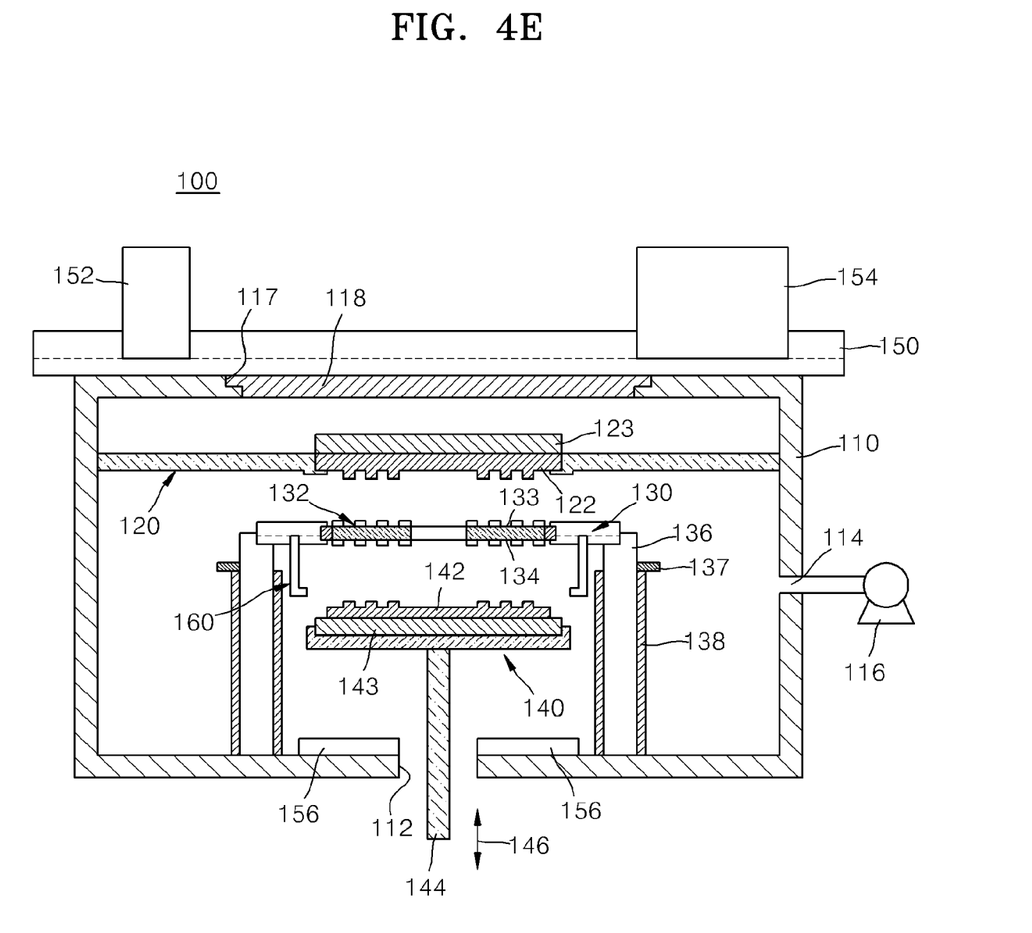

Referring to FIG. 4E, after releasing the locking device 160, the vertical moving device 146 is further moved downwards, and the medium 132 is released from the second mold 142.

If the second mold 142 and the medium 132 are moved downwards after releasing the locking device 160 in advance, the medium supporting unit 130 stops at the first position by the stopper 137 and the medium supporting unit 130 moves further downwards, and thus, the medium 132 may be released from the second mold 142.

Figure 5:
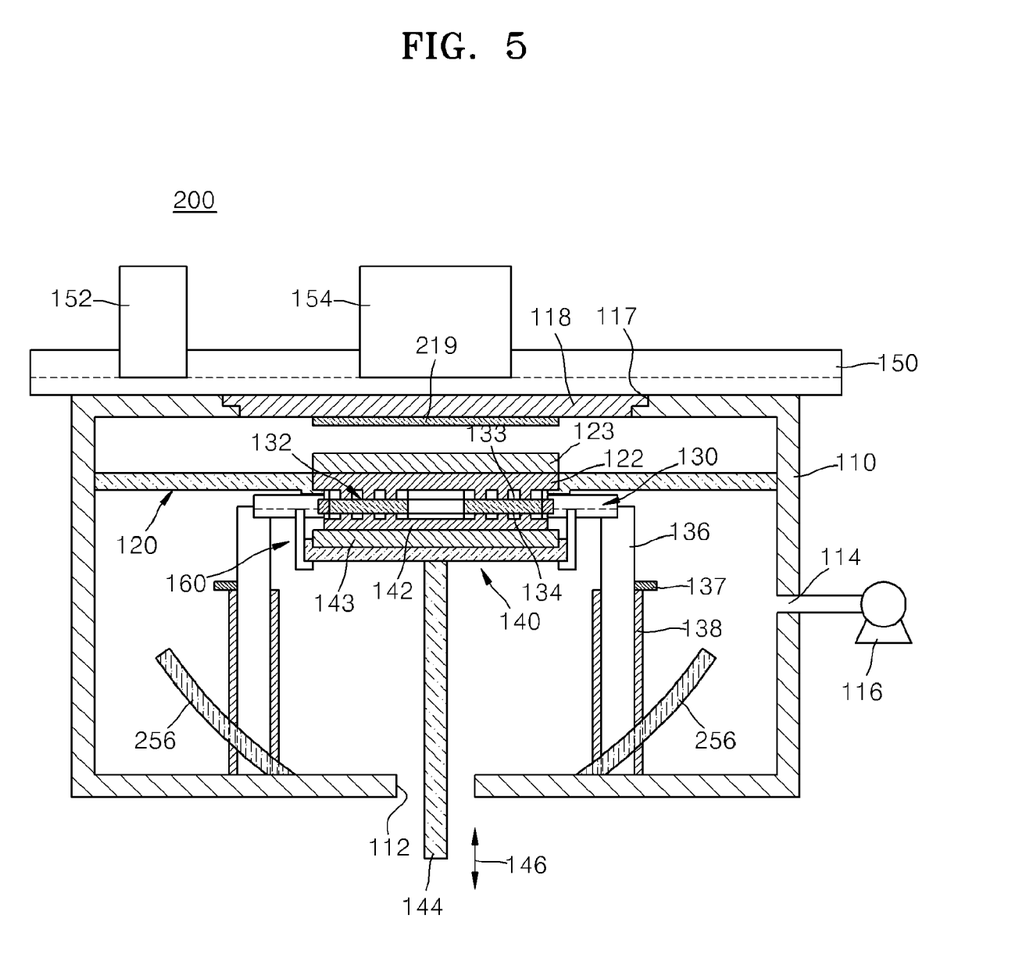
FIG. 5 is a cross-sectional view of a dual-side imprinting lithography system according to another embodiment of the present invention.

FIG. 5 is schematic cross-sectional view of a dual-side imprinting lithography system 200 according to another embodiment of the present invention. Like reference numerals are used to indicate elements that are substantially identical to the elements of the dual-side imprinting lithography system 100, and thus the detailed description thereof will not be repeated.

Referring to FIG. 5, the dual-side imprinting lithography system 200 for large scale nano-imprinting, according to the current embodiment of the present invention includes an optical path changing member 256 as a second UV radiating device. The optical path changing member 256 supplies UV rays to the lower side of the second mold 142 by receiving the UV rays from the first UV radiating device 154. That is, UV rays may simultaneously be supplied to the first and second surfaces 133 and 134 of the medium 132 using one UV radiating device 154.

The window 117 has an area greater than that of the medium 132. Thus, UV rays emitted from the first UV radiating device 154 enter the optical path changing member 256 installed on the bottom of the chamber 110. The optical path changing member 256 may include a mirror surface thereon, and preferably, may have a curve shape so that the UV rays may be uniformly radiated onto the lower surface of the second mold 142 in a state in which the medium 132 and the second mold 142 are located together below the first mold 122. The optical path changing member 256 may be formed of an annular concave mirror in regions except for the first cylinder rod 136 and the pipes 138.

The optical path changing member 256 may include a wave guide plate instead of the mirror.

A UV reducing filter 219 that reduces the intensity of UV rays may be installed in a region corresponding to the second mold 142 on a lower surface of the quartz 118. The UV reducing filter 219 may be a neutral density (ND) filter, and the ratio of UV intensity reduction may be controlled so that the intensity of UV rays radiated onto the first mold 122 may be identical to the intensity of UV rays radiated onto the second mold 142 through the optical path changing member 256.

A method of driving the dual-side imprinting lithography system 200 according to the current embodiment is substantially identical to the method of driving the dual-side imprinting lithography system 100, and thus, the description thereof will not be repeated.

The dual-side imprinting lithography system according to the present invention may reduce manufacturing costs and increase productivity when applied to manufacture patterned media of HDDs.

While a dual-side imprinting lithography system according to the present invention has been particularly shown and described with reference to exemplary embodiments thereof, it will be understood by those of ordinary skill in the art that various changes in form and details may be made therein without departing from the spirit and scope of the present invention as defined by the following claims.

What is claimed is:

1. A dual-side imprinting lithography system comprising:
   a medium supporting unit that supports a medium wherein both surfaces of the medium are coated with a ultraviolet (UV) hardening resin;
   a first mold supporting unit and a second mold supporting unit that respectively support a first mold and a second mold, disposed respectively above the medium supporting unit and under the medium supporting unit;
   a vertical moving device that moves vertically at least one of the medium supporting unit, the first mold supporting unit, and the second mold supporting unit;
   a first UV radiating device that is installed above the first mold supporting unit to radiate UV rays;
   a second UV radiating device that is installed under the second mold supporting unit to radiate UV rays;
   a chamber that accommodates the medium supporting unit, the first mold supporting unit, and the second mold supporting unit;
   an X-Y stage that drives the second mold supporting unit in two-axis directions; and
   a locking device that selectively fixes the second mold supporting unit and the medium supporting unit,
   wherein the first mold supporting unit is fixedly installed in the chamber, the medium supporting unit is movably installed between the first mold supporting unit and the second mold supporting unit, and the vertical moving device drives the second mold supporting unit.

2. The dual-side imprinting lithography system of claim 1, further comprising a vacuum apparatus connected to the chamber.

3. The dual-side imprinting lithography system of claim 1, further comprising a linear guide installed above the chamber, wherein the first UV radiating device is installed on the linear guide.

4. The dual-side imprinting lithography system of claim 3, further comprising an alignment optical device installed on the linear guide.

5. The dual-side imprinting lithography system of claim 1, wherein the second UV radiating device is an optical path changing member that supplies UV rays received from the first UV radiating device to the second mold.

6. The dual-side imprinting lithography system of claim 5, wherein the second UV radiating device comprise an annular concave mirror.

7. The dual-side imprinting lithography system of claim 5, further comprising a UV reducing filter that is installed in a region where UV rays enter into the first mold from the first UV radiating device to reduce an intensity of the UV rays radiated onto the first mold.

8. The dual-side imprinting lithography system of claim 7, wherein the UV reducing filter is a neutral density (ND) filter.

9. The dual-side imprinting lithography system of claim 1, further comprising a rotation stage that rotates the second mold supporting unit.

10. The dual-side imprinting lithography system of claim 1, further comprising a dual-side coating device that simultaneously coats the UV hardening resin on the both surfaces of the medium, wherein the dual-side coating device comprises:
   a fixing chuck that fixes the medium;
   a vertical driving unit that moves the fixing chuck vertically;
   a rotation driving unit that rotates the fixing chuck; and
   a resin storage unit that contains the UV hardening resin.

* * * * *